(12) United States Patent
Carlson et al.

(10) Patent No.: US 8,803,187 B2
(45) Date of Patent: Aug. 12, 2014

(54) PROTECTION OF LIGHT EMITTING DEVICES

(71) Applicant: Empire Technology Development LLC, Wilmington, DE (US)

(72) Inventors: William Brenden Carlson, Seattle, WA (US); Georgius Abidal Adam, Edensor Park (AU); Christopher John Buntel, Singapore (SG); Kenichi Hashizume, Kitagunma-gun (JP); Vincenzo Casasanta, III, Woodinville, WA (US)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 13/830,068

(22) Filed: Mar. 14, 2013

(65) Prior Publication Data

US 2014/0110679 A1    Apr. 24, 2014

(30) Foreign Application Priority Data

Oct. 22, 2012  (WO) ................ PCT/US2012/061357

(51) Int. Cl.
    H01L 33/00 (2010.01)
    H01L 51/52 (2006.01)
(52) U.S. Cl.
    CPC ......... *H01L 51/5259* (2013.01); *Y10S 438/956* (2013.01)
    USPC .......... 257/99; 257/81; 257/91; 257/E25.028; 257/E27.119; 257/E33.001; 438/26; 438/956
(58) Field of Classification Search
    USPC .............. 257/79, 80, 81, 82, 91, 99, E27.119, 257/E25.028, E33.001; 438/22, 26, 956
    See application file for complete search history.

(56) References Cited

U.S. PATENT DOCUMENTS

| 6,331,333 | B1 | 12/2001 | Wu et al. |
| 6,465,953 | B1 | 10/2002 | Duggal |
| 6,770,502 | B2 | 8/2004 | Cok et al. |
| 6,818,479 | B2 | 11/2004 | Boroson et al. |
| 6,835,953 | B2 | 12/2004 | Cok et al. |
| 6,888,307 | B2 | 5/2005 | Silvernail et al. |
| 7,589,465 | B2 | 9/2009 | Carr |
| 8,022,624 | B2 | 9/2011 | Ricks et al. |
| 8,044,571 | B2 | 10/2011 | Liu |
| 2001/0011868 | A1 | 8/2001 | Fukunaga et al. |
| 2004/0048033 | A1 | 3/2004 | Klausmann et al. |

(Continued)

FOREIGN PATENT DOCUMENTS

| CN | 101866944 | 10/2010 |
| WO | WO-2008/043848 | 4/2008 |

OTHER PUBLICATIONS

SAES Group, "SAES Getters," Product Groups, downloaded from http://www.saesgetters.com/product-groups/getters on Mar. 1, 2013, 2 pages.

(Continued)

*Primary Examiner* — Su Kim
(74) *Attorney, Agent, or Firm* — Foley & Lardner LLP

(57) ABSTRACT

A light emitting device, includes a light emitting diode unit on a substrate; a gas-generating species; an inert gas; a barrier; and a sealant; wherein: the sealant, barrier, and substrate define a protective chamber; and the light emitting diode unit, the gas generating species, and the inert gas are disposed within the chamber.

29 Claims, 1 Drawing Sheet

(56) References Cited

U.S. PATENT DOCUMENTS

| | | | |
|---|---|---|---|
| 2005/0269951 A1* | 12/2005 | Handa et al. | 313/512 |
| 2006/0043889 A1 | 3/2006 | Kim et al. | |
| 2006/0087230 A1 | 4/2006 | Ghosh et al. | |
| 2006/0141204 A1 | 6/2006 | Rogler et al. | |
| 2006/0240278 A1 | 10/2006 | Hatwar et al. | |
| 2008/0193747 A1 | 8/2008 | MacDonald et al. | |
| 2008/0258111 A1 | 10/2008 | Ye et al. | |
| 2009/0081360 A1 | 3/2009 | Fedorovskaya et al. | |
| 2010/0001634 A1* | 1/2010 | Fujita et al. | 313/504 |
| 2011/0127660 A1 | 6/2011 | Torres et al. | |
| 2011/0217544 A1 | 9/2011 | Young et al. | |

OTHER PUBLICATIONS

Cookson Electronic Polymers "HiCap™ and StayDry™ Getter Materials," Technical Data Sheet, Alpha Advanced Materials, downloaded on Feb. 21, 2013 from http://www.cooksonsemi.com/products/polymer/hicap-staydry.asp 1 page.

International Search Report and Written Opinion received for PCT/US2012/061357 dated Jan. 23, 2012.

McCormick F., "Barrier Films and Adhesives for Display Applications," New Industrial Chemistry and Engineering Workshop on: OLED Materials for Lighting Displays, Jun. 6-8, 2011, Workshop Agenda, 8 pages.

Novaled AG, "Novaled develops highly power-efficient white PIN OLEDs with long lifetime and excellent light quality," News & Press Releases, Novaled: Creating the OLED Revolution, Jul. 13, 2011, 2 pages.

Park, JH, et al., "Preparation of CaO as OLED getter material through control of crystal growth CaCO3 by block copolymers in aqueous solution," Materials Research Bulletin, Jan. 8, 2009, vol. 44, No. 1, pp. 110-118.

Pressley, E., "DuPont Signs Technology Agreement for Large AMOLED Television Displays," DuPont OLED Technology, Nov. 2, 2011, downloaded from http://www2.dupont.com/OLED/en_US/whats_new/article20111102.html, 3 pages.

SAES Getters Grouop, "SAES® Getters' DryFlex® Enhances OLED Display Lifetime over 30%," Press Release, Apr. 19, 2006, downloaded from http://www.oled-info.com/files/Saes%20Getters_DryFlex.pdf, 2 pages.

* cited by examiner

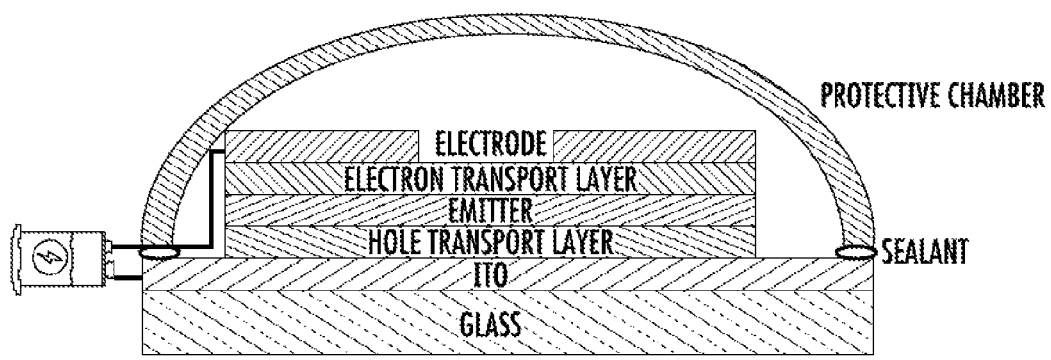

PROTECTION OF LIGHT EMITTING DEVICES

CROSS-REFERENCE TO RELATED APPLICATIONS

This U.S. patent application claims the benefit of International Application No. PCT/US2012/061357, filed on Oct. 22, 2012, the entire contents of which are incorporated herein by reference in their entirety for any and all purposes.

FIELD

The present technology relates to protecting light emitting devices. More specifically, the technology is directed to a method for protecting the light emitting diode of a light emitting device from oxygen and/or water.

BACKGROUND

The following description is provided to assist the understanding of the reader. None of the information provided or references cited is admitted to be prior art to the present technology.

An OLEDa (organic light-emitting diode) is a light-emitting diode (LED) in which the emissive electroluminescent layer is a film of organic compound which emits light in response to an electric current. OLEDs have been used as electronic displays in a variety of devices including hand-held devices such as mobile phones and cameras, and display monitors coupled to computer systems. In its simplest form, an OLED consists of organic semiconductor compound sandwiched between two electrodes. The electrodes are a source of electrons (cathode) and holes (anode). Indium tin oxide (ITO) is commonly used as the anode because it is transparent to visible light and has a high work function. OLED devices typically include two or more layers of the individual sandwiches to improve the efficiency of the device.

One disadvantage of OLED displays is their sensitivity to water and oxygen. Contact with one or both of these agents significantly decreases the efficiency of OLED's, while prolonged exposure to these agents can destroy OLED's. Although some methodologies have been proposed to protect the OLED from oxygen and water, there is considerable room for improvement.

SUMMARY

The foregoing summary is illustrative only and is not intended to be in any way limiting. In addition to the illustrative aspects, embodiments and features described above, further aspects, embodiments and features will become apparent by reference to the following drawings and the detailed description.

In one embodiment is provided a light emitting device that comprises a light emitting diode unit deposited on to a substrate, a gas-generating species, a barrier; and a sealant. The sealant, barrier, and substrate define a protective chamber within which chamber are disposed the light emitting diode unit, the gas generating species, and the inert gas. According to one aspect, the light emitting diode unit is an organic light emitting diode unit and a water-reactive material, an oxygen-reactive material, or both a water-reactive material and an oxygen-reactive material are disposed within the sealant or the protective chamber.

The barrier of the light emitting devices according to the present technology may be made of plastic, ceramic, or glass. For certain embodiments an inert gas, such as $N_2$, Ar or a combination of these two gases can be disposed within the protective chamber. A gas generating species may also be present within the protective chamber. For such embodiments, the gas generating species is a compound selected from $^{40}K$, a carbodiimide, an azo-compound, a cyanamide, a trizaole, an isocyanate or a combination of any two or more these compounds. Typically, the pressure of the inert gas placed within the protective chamber or the inert gas generated by decomposition of the gas generating species within the protective chamber is from about 1 bar to about 1.2 bar.

Sealants used to contact the barrier to the substrate containing the light emitting diode can be an epoxy polymer, an acrylic polymer, an acrylamide polymer, a polystyrene, a polyurethane, polyurea, polythiophene, polyphenylene, polyphenylene oxide, polyimides, polyamide, polyvinyl acetate, polyvinyl alcohol, polyethylene, polyolefin, polyesters, polyether, polytetrafluoroethylene, or a combination of any two or more these polymeric materials. In some embodiments the sealant used comprises a polymer having a carbodiimide, a cyanamide, an azo-group, a triazole, an isocyanate or a combination of these groups pendant to the polymeric backbone.

In certain embodiments, the gas generating species comprises dicyclohexyl carbodiimide, N,N'-diisopropyl carbodiimide, N-(2-methyliminomethylene-ethyl)acrylamide, a poly-N-(2-methyliminomethylene-ethyl)acrylamide or a combination of any two or more these compounds. For instance, the gas generating species can be a poly-N-(2-methyliminomethylene-ethyl)acrylamide.

In some embodiments, gas generating species such as dicyclohexyl carbodiimide, N,N'-diisopropyl carbodiimide, N-(2-methyliminomethylene-ethyl)acrylamide, a poly-N-(2-methyliminomethylene-ethyl)acrylamide or a combination of any two or more these compounds are contained within the sealant. Alternatively, the sealant can comprise N-(1-H-(1,2,4)-triazol-3-yl)-acrylamide as the gas generating species.

According to one embodiment the sealant comprises a polyacrylamide having a repeat unit represented by Formula I. For Formula I compounds the polyacrylamide has a molecular weight from about 1000 g/mol to about $10 \times 10^6$ g/mol.

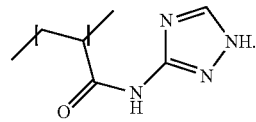

Formula I

In some embodiments the gas generating material or the sealant comprises an isocyanate, for example, the compound 2-methyl-acrylic acid-2-isocyanato-ethyl ester or a polymerization product of 2-methyl-acrylic acid-2-isocyanato-ethyl ester represented by monomeric repeating units according to Formula II.

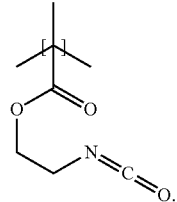

Formula II

In certain embodiments the gas generating material or the sealant comprises an azo compound. Illustrative of such compounds are azo bis-isobutyronitrile or azo bis-(cyclohexanecarbonitrile). The substrate of the light emitting device can be a polymer, glass, a ceramic, or a combination of any two or more such materials. The substrate is optically transparent and has an electrically conductive coating. Illustrative of coating materials are compounds selected from indium tin oxide, styrene/carbon nanotubes, titanium nitride, fluorine doped tin oxide, polythiophene derivatives, polyacetylene, zinc indium tin oxide, zinc oxide doped with aluminum and gallium, titanium dioxide doped with niobium and tantalum, zinc tin oxide, indium zinc tin oxide, indium zinc gallium oxide, or gadolinium nitride.

Light emitting devices according to the present technology have an operable life-span of about 20,000 hours to about 40,000 hours. According to one embodiment the cathode comprising $^{40}K$ or an alloy of $^{40}K$.

Also provided is a process for the manufacture of an light emitting device by depositing an light emitting diode unit on to a substrate, depositing a gas generating species on the substrate, overlaying the light emitting diode unit with a barrier material; and sealing the barrier material to the substrate with a sealant. The barrier, sealant, and substrate define a protective chamber encapsulating the organic light emitting diode unit, and the gas generating species. In one embodiment the light emitting diode unit is an organic light emitting diode unit and the barrier is made of plastic, ceramic, glass, or a combination of any two or more of such materials.

According to one aspect, the manufacture of the light emitting device is conducted under a first inert gas that is selected from $N_2$, Ar or a combination these gases. Exemplary of gas generating species include without limitation $^{40}K$, a carbodiimide, an azo-compound, a cyanamide, a trizaole, an isocyanate or combinations of any two or more these compounds.

The inert gas produced as a result of the decomposition of these gas generating species can be the same as or different form the first inert gas. For instance, $^{40}K$ can decompose radioactively or by reaction with water or oxygen to form argon as the second inert gas. For certain embodiments, at least one water-reactive material, at least one oxygen reactive material or both are deposited on the substrate prior to sealing of the light emitting diode to the substrate. Such materials are deposited to protect the organic light emitting diode from contacting water, oxygen or both and these materials can be deposited in the form of granules, powder, pellets, a polymeric sheet, or a porous construct on to the substrate.

The present technology in one of its embodiments also provides a process for the manufacture of an light emitting device by depositing an light emitting diode unit on a substrate and overlaying the light emitting diode unit with a barrier material so that the barrier and substrate define a protective chamber that is configured to maintain a vacuum that encapsulates the organic light emitting diode unit.

BRIEF DESCRIPTION OF THE DRAWING

FIG. 1 illustrates an LED device protected by a dome, according to one embodiment.

DETAILED DESCRIPTION

The illustrative embodiments described in the detailed description and claims are not meant to be limiting. Other embodiments may be used, and other changes may be made, without departing from the spirit or scope of the subject matter presented here.

The present technology is described herein using several definitions, as set forth throughout the specification.

As used herein, unless otherwise stated, the singular forms "a," "an," and "the" include plural reference. Thus, for example, a reference to "a cell" includes a plurality of cells, and a reference to "a molecule" is a reference to one or more molecules.

As used herein, "about" will be understood by persons of ordinary skill in the art and will vary to some extent depending upon the context in which it is used. If there are uses of the term which are not clear to persons of ordinary skill in the art, given the context in which it is used, "about" will mean up to plus or minus 10% of the particular term.

OLEDs are sensitive to water and oxygen. The present technology provides a method for the manufacture of a light emitting device, for example, a device having a light emitting diode (LED) or an organic light emitting diode (OLED) that is prevented from contact with water and oxygen by the use of a barrier and sealant. In one embodiment, the light emitting device has a substrate on which is supported a LED or an OLED. The LED or OLED together with the substrate, barrier and sealant defines a protective chamber that essentially encapsulates or covers the LED or OLED.

Various approaches are used herein to help protect OLEDs against damage from water and/or oxygen. One approach is to use materials that can react with the water and/or oxygen, making these agents unavailable or incapable of harming the OLEDs. Another approach is to use materials that can release an inert gas and provide a positive pressure environment within the vicinity of the OLED, to help block the entry of water and/or oxygen. Alternatively, a combination of the above two approaches can be used, where a reaction of the protective material with water and/or oxygen also releases an inert gas.

According to one aspect, one or more gas generating compounds, a compound that can consume or react with oxygen, water, or both oxygen and water and any combinations of these reagents is placed within the protective chamber. FIG. 1 illustrates a light emitting device according to one embodiment of the present technology. The illustrated device contains a substrate on which is placed a LED or an OLED and a barrier that encapsulates the LED or OLED. Within the context of the present technology, the terms water, moisture, water vapor, or mist may be used interchangeably. These terms are used to describe liquid water, pure gaseous water, or a mixture of gaseous water and air. The light emitting device may initially further contain an inert gas to maintain a neutral or positive pressure within the chamber. Alternatively, the light emitting device may initially be under a vacuum with the gas generating compound producing an inert gas to fill the chamber.

According to FIG. 1, the substrate supporting the OLED device can be a flat transparent surface that can be made of a variety of materials such as glass, polymer, ceramic or plastic and suitable combinations of two or more of these materials. For certain embodiments the substrate is a flat transparent glass surface that is generally coated with an optically transparent and electrically conductive material. Illustrative of materials suitable for coating the substrate include without limitation indium tin oxide, styrene/carbon nanotubes, titanium nitride, fluorine doped tin oxide, polythiophene derivatives, polyacetylene, zinc indium tin oxide, zinc oxide doped with aluminum and gallium, titanium dioxide doped with niobium and tantalum, zinc tin oxide, indium zinc tin oxide, indium zinc gallium oxide, or gadolinium nitride.

The OLED device can be an organic semiconductor having conductive and emissive layers situated between the anode and cathode respectively. While the anode (positive electrode) can be made of any material having a high work function and capable of promoting the injection of holes into the conductive layer, indium tin oxide (ITO) is often used as the anode material since it is electrically conductive, transparent to visible light and has a high work function. ITO is frequently used, therefore, as a coating for the glass substrate.

This ITO layer also functions as the anode for the light emitting device. As illustrated in FIG. 1, overlaying the anode is a conductive layer also known as the hole transport layer. An emissive layer containing a emitter material and an electron transport layer are contacted with the conductive layer. The cathode (negative electrode) contacts the surface of the emissive layer that is distal to the surface of the emissive layer contacting the conductive layer. The cathode, emissive layer, conductive layer and anode together form the LED or OLED device.

The protective chamber defined by a barrier, sealant or adhesive and the substrate encapsulates the OLED device as illustrated in FIG. 1. While the shape of the barrier is unimportant, the barrier preferably rises above the OLED device so as to define a space between the OLED device and the inner surface of the barrier. In one embodiment the barrier is dome shaped and is made of a material that is impervious to water, oxygen or both water and oxygen. Exemplary barrier materials include without limitation plastics, ceramics and glass.

The barrier can be sealed to the substrate supporting the OLED device to prevent the OLED device from contacting water or oxygen. Adhesives or sealants can be applied at the interface of the dome shaped barrier and support to seal the OLED within the protective chamber. In addition to the sealant, light emitting devices according to the present technology may also use an inert gas or an inert gas generating species within the dome shaped barrier to prevent contact of water, oxygen or both with the OLED or LED.

According to one aspect, therefore, the sealant can be a compound that can react with oxygen, water, or both so as to prevent these agents from contacting the OLED. Alternatively, the sealant can be a compound that prevents the passage of water, oxygen, or both into the protective chamber. Some sealant materials, moreover, are compounds that release an inert gas upon contact with water or oxygen. According to one embodiment, one or more gas generating compounds, a compound that can consume or react with oxygen, water, or both oxygen and water and any combinations of these reagents are present in the sealant. In the context of the present technology, the terms "sealant" and "adhesive" are being used interchangeably. These terms refer to natural or synthetic compounds or materials that adhere or bond items together and may also provide a barrier to the passage of certain substances through the sealant layer.

As stated above, sealants can be used to maintain an impervious contact between the barrier and the substrate supporting the OLED device. The sealant can be any compound or polymer that provides an impenetrable barrier to liquid water, gaseous water, and oxygen and permits the barrier and substrate to remain in contact with each other. Illustrative of such sealant materials without limitation are epoxy polymers, acrylic polymers, acrylamide polymers, polystyrenes, polyurethanes, polyureas, polythiophenes, polyphenylenes, polyphenylene oxides, polyimides, polyamides, polyvinyl acetates, polyvinyl alcohols, polyethylenes, polyolefins, polyesters, polyethers, polytetrafluoroethylenes, or combinations of any two or more of these compounds.

According to one embodiment, the sealant is a polymer that contains an inert gas generating species as a group pendant to the polymeric backbone. Thus, the present technology encompasses sealant materials that have a carbodiimide, cyanamide, an azo, a triazole, an isocyanate group, or combinations thereof pendant to the polymer's backbone. Illustrative of such sealant materials without limitation are polymers that have a dicyclohexyl carbodiimide, N,N'-diisopropyl carbodiimide group, a N-(2-methyliminomethylene-ethyl)acrylamide group, a poly-N-(2-methyliminomethylene-ethyl)acrylamide or a combination of any two or more of these moieties as the group pendant to the backbone of a polymeric sealant.

In certain embodiments the sealant is a polymer of N-(2-methyliminomethylene-ethyl) acrylamide. Monomeric N-(2-methyliminomethylene-ethyl)acrylamide was readily obtained by contacting N-methylurea is with 2chloroethylacrylamide to yield N-[2-(3-methyl-ureido)-ethyl]-acrylamide, which upon dehydration gave the monomer N-(2-methyliminomethyleneamino-ethyl)-acrylamide. See Scheme 1. This monomer was readily polymerized using a free radical initiator such as azobisisobutyronitrile or benzoyl peroxide. The polymeric product can be used as a sealant. Alternatively, the polymer can be fabricated to form a porous layer that encapsulates the OLED.

Scheme 1

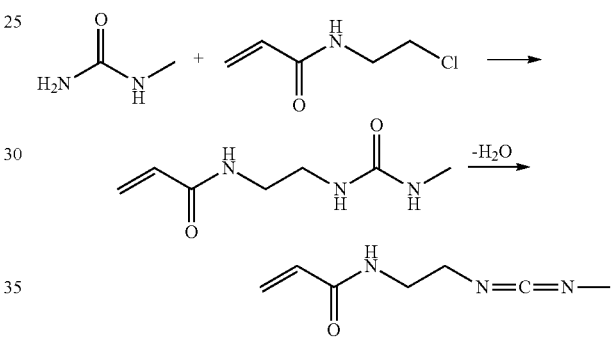

Other polymeric sealant materials include those having one or more triazole groups, polyhydrazines, or tetrazoles pendant to the polymer's backbone. In certain embodiments, the sealant is a polyacrylamide according to Formula I having a 5-aminotriazole group pendant to the polymer's backbone.

I

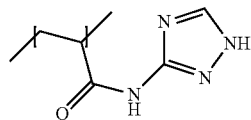

Polyacrylamides according to Formula I are efficient at scavenging oxygen and water and are readily obtained by contacting acryloyl chloride with 5-amino-1,2,4-triazole. The superior water scavenging ability of a Formula I triazole polymer is due to reactivity of triazoles with water as illustrated in Scheme 2.

Scheme 2

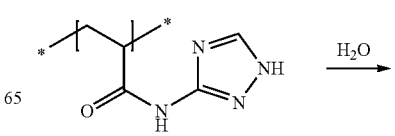

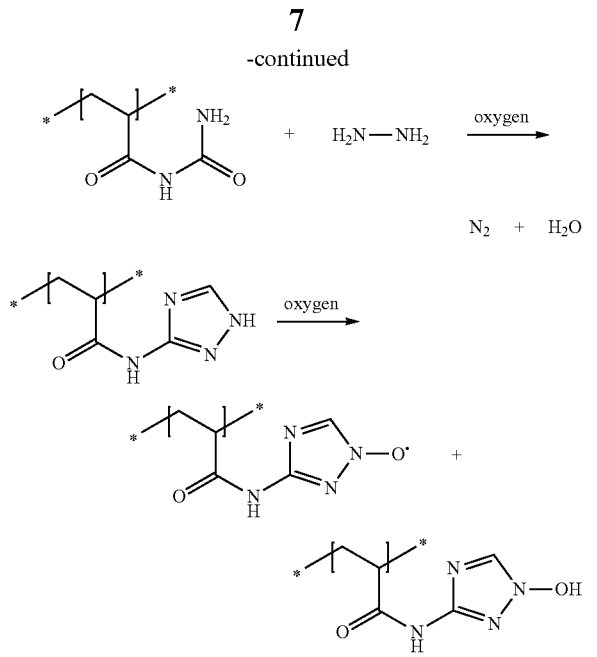

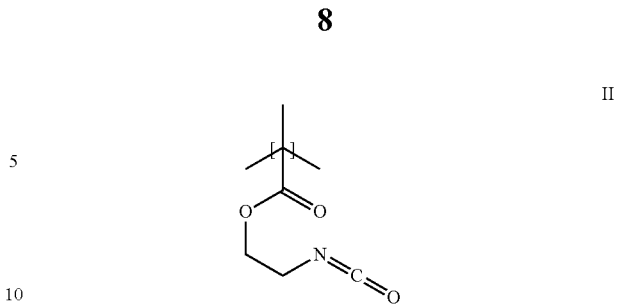

Isocyanates are organic compounds having a R—N=C=O structure. While isocyanates have been used extensively as cross-linking agents these compounds are also useful in the manufacture of polyurethanes and polyureas. For instance, many acrylic automobile coatings are crosslinked using isocyanates while polyurethanes manufactured using isocyanates are used as furniture coatings and as foam in pillows.

Isocyanates react vigorously with nucleophiles such as alcohols, amines and water. When water is the nucleophile, the resultant carbamic acid decomposes to the corresponding amine and carbon dioxide. Polymers containing isocyanate groups, therefore, are suitable scavengers of water. Isocyanates can also scavenge oxygen. Briefly, the amine formed upon decomposition of carbamic acid can react with oxygen to form a nitroso compound or nitro compounds. See Scheme 3. Thus, polymers containing isocyanate groups provide protection from both water and oxygen and are suitable for protecting OLED devices.

Scheme 3 also illustrates the free radical polymerization of 2-methylacrylic acid-2-isocyanato ethyl ester. The resultant polyacrylate has pendant isocyanate groups. Such polymers, moreover, are thermoplastic and can readily be molded into a variety of shapes that would allow these polymers to encapsulate an OLED or be fabricated as porous sheets or particles that can be contained within the OLED's protective chamber.

Triazoles react with water to form urea and hydrazine. The latter is a powerful reducing agent that will readily reduce oxygen present within the OLED's protective chamber to form nitrogen and water. The water thus formed reacts with another molecule of a Formula I polymer, thus protecting the OLED from water.

Triazoles are also efficient suppressors of oxidation. For instance, a 1,2,4-triazole reacts with oxygen at the saturated nitrogen moiety to form N-oxyl radicals, N-oxides, or N-hydroxyl moieties. See Scheme 2. By sequestering free oxygen that may be present within the OLED's protective chamber Formula I compounds prevent the OLED's from being damaged, thus increasing the operable life of OLED devices.

The triazolo polyacrylamide according to Formula I can have an average molecular weight of about 1000 g/mol to about $10 \times 10^6$ g/mol. For certain embodiments the Formula I polymer has an average molecular weight from about $5 \times 10^3$ g/mol, about $1 \times 10^4$ g/mol, about $5 \times 10^4$ g/mol, about $1 \times 10^5$ g/mol, about $2 \times 10^5$ g/mol, about $3 \times 10^5$ g/mol, about $4 \times 10^5$ g/mol, about $5 \times 10^5$ g/mol, about $6 \times 10^5$ g/mol, about $7 \times 10^5$ g/mol, about $8 \times 10^5$ g/mol, about $9 \times 10^5$ g/mol, about $1 \times 10^6$ g/mol, about $2 \times 10^6$ g/mol, about $3 \times 10^6$ g/mol, about $4 \times 10^6$ g/mol, about $5 \times 10^6$ g/mol, about $6 \times 10^6$ g/mol, about $7 \times 10^6$ g/mol, about $8 \times 10^6$ g/mol, or about $9 \times 10^6$ g/mol, or ranges between any two of these values.

Commercially available polyvinylpyrolidone is another useful material to protect the OLED devices. This polymer is an efficient scavenger of oxygen and water. For instance, polyvinylpyrolidones alone or as copolymers with polyvinyl alcohols are routinely used in the manufacture of wound dressings because of their superior water absorption ability. These polymers react with oxygen through oxidative chain scission processes and are therefore suitable for use as scavengers of molecular oxygen.

Acrylate polymers that have a monomeric repeating unit according to Formula II have an isocyanate as the pendant functional group are exemplary of another class of polymeric sealants.

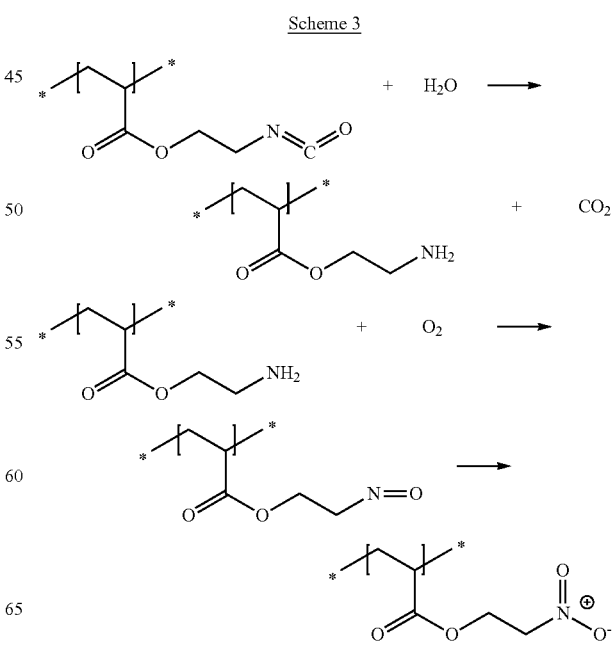

-continued

Polymerization Reaction

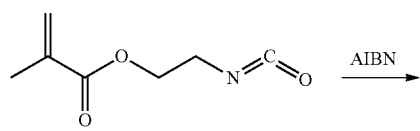

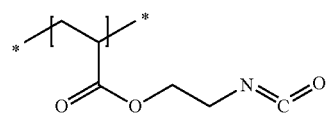

During the operation of an OLED device, water or water vapor present in the air surrounding the device will attempt to penetrate the sealant and enter the protective chamber. The free isocyanate groups of the polymeric sealant, however, can readily scavenge the water and prevent it from damaging the OLED. An additional barrier to the entry of water into the protective chamber is provided by the carbon dioxide released as a product of the reaction of water with isocyanate polymer. The carbon dioxide gas produced as a product of the reaction of water with an isocyanate group will cause the pressure within the OLED's protective chamber to be greater than the pressure outside the protective chamber, effectively preventing water and oxygen from entering the OLED's protective chamber and increasing the operable life of the OLED devices.

Azo compounds having the general structure R—N=N—R can also be incorporated into a polymer sealant material. These compounds release nitrogen gas upon thermal decomposition and are suitable scavengers of water and oxygen. For instance, the half life for the release of nitrogen from a crystalline or powder form of AIBN at 100° C. is about 3 minutes. However, the half life of release increases significantly at lower temperatures. At 80° C. it takes about 3 hours for AIBN releases half of its nitrogen, while at 50° C. the half life is about 74 hours. Most OLED devices are used at room temperatures, however. The half life for the release of nitrogen from AIBN at room temperature is about a month (30 days). 1,1-azobis(cyclohexanecarbonitrile) releases nitrogen about two orders of magnitude more slowly than AIBN. That is, the half life for the release of nitrogen from 1,1-azobis(cyclohexanecarbonitrile) is over a year.

The carbonitrile radicals formed as products of thermal decomposition, moreover, are useful scavengers of oxygen. Scheme 4 illustrates this process.

Scheme 4

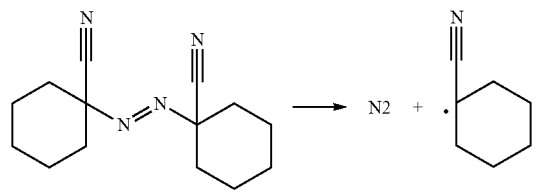

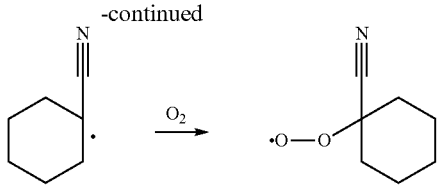

The operable life of an OLED device significantly increases when oxygen and water are prevented from coming in contact with the OLED. The present technology uses an inert gas, an inert gas generating species, or both to prevent water and oxygen from entering the protective chamber. In one embodiment, therefore, the protective chamber contains an inert gas, such as argon or nitrogen, that is maintained under pressure, for example, at about 1 bar to about 1.5 bar. The use of an inert gas under pressure prevents the accumulation or build up of water and oxygen within the protective chamber. For example, the pressure at which the inert gas is maintained within the protective chamber may be about 1.1 bar, 1.2 bar, 1.3 bar or about 1.4 bar. In some embodiments, the pressure at which the inert gas is maintained within the protective chamber is at least 1.1 bar. In some embodiments, the pressure at which the inert gas is maintained within the protective chamber is at least 1.3 bar. In some embodiments, the pressure at which the inert gas is maintained within the protective chamber is at least 1.5 bar.

For certain embodiments, however, an inert gas generating species is placed within the protective chamber of the light emitting device. Within the context of the present technology, the phrase "inert gas generating species" refers to compounds which produce an inert gas upon reaction with oxygen or water. For instance, an inert gas generating species may be a compound that will release an inert gas upon contact with water, oxygen or both.

In one embodiment, potassium-40 ($^{40}$K), a radioactive metal having a long half life of decay of $10^9$ years is used as the inert gas generating species. $^{40}$K undergoes radioactive decay by two possible pathways. Approximately, 11% of potassium-40's disintegrations are by electron capture and result in the formation of argon 40, which is an inert gas. The remaining eighty-nine percent of the disintegrations occur by beta emission to yield calcium-40, which is a metal. Scheme 5 illustrates the decay pathways for the formation of argon-40 and calcium 40 respectively.

Scheme 5

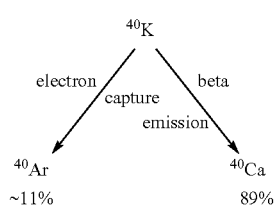

Both argon-40 and calcium-40 produced by radioactive decay of potassium-40, however are stable isotopes that can serve as barriers preventing water, oxygen or both from contacting the OLED. In one embodiment, potassium-40 is introduced within the protective chamber and its decay results in an increase in the concentration of argon-40 within the protective chamber. As a result, the pressure of gas, such as argon-40 within the protective chamber increases above atmospheric pressure and serves as a barrier to entry of water and/or oxygen into the protective chamber. Additionally, some amount of argon-40 may diffuse into the sealant and provide an additional barrier to the entry of water and oxygen through the sealant material.

While some argon-40 escapes from the protective chamber during the operable life of the light emitting device, the lost argon-40 is readily replenished by decay of potassium-40 present within the protective chamber. Both potassium-40 and calcium-40 provide further protection by consuming water that may enter the OLED's protective chamber. For instance, both metals readily react with water to form their corresponding hydroxides which are less harmful to the OLED than water. Potassium-40 can also scavenge oxygen by forming an oxide, for example, by forming potassium oxide, potassium peroxide, or potassium super oxide. Thus, any oxygen that may penetrate the protective chamber will be consumed by potassium-40 before it can contact and harm the OLED. Calcium-40 too, can react with oxygen to form calcium oxide and extend the operable life of the OLED. In addition to its use as a scavenger of oxygen and water, calcium-40 can be used as the cathode of an OLED since it has a low work function and can easily inject electrons into the emissive layer of the OLED.

When potassium-40 is used as the gas generating species, it can be in the form of a powder, mesh, nanoparticles, pellets, porous construct, or granules. Other compounds such as the carbimides, azo compounds, triazoles, tetrazoles and isocyanates that also scavenge water, oxygen or both can be included along with potassium-40 as the gas generating species. In one embodiment, carbimides, azo compounds, triazoles, tetrazoles and isocyanates can replace or be used in conjunction with potassium-40 as scavengers of oxygen and/or water. These scavengers can be used individually or two or more of these scavenging reagents may be placed together within the dome shaped barrier that forms the protective chamber.

As described herein above, carbimides, azo compounds, triazoles, tetrazoles and isocyanates can protect the OLED from water and oxygen or both and extend the operable life of a light emitting device by virtue of these compounds ability to react and consume oxygen and water as described above. In one embodiment, therefore, the present technology encompasses a light emitting device that has dicyclohexyl carbodiimide, N,N'-diisopropyl carbodiimide, N-(2-methyliminomethylene-ethyl)acrylamide, a poly-N-(2-methyliminomethylene-ethyl)acrylamide or a combination of any two or more these reagents as the gas generating species. In certain embodiments, the gas generating species is a Formula I compound, for instance, N-(1-H-(1,2,4)-triazol-3-yl)-acrylamide.

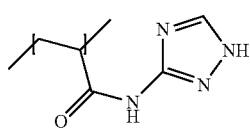

I

Isocyanates according to Formula II can also be used as gas generating species. Protection against the harmful effects of water by Formula II compounds is due to the reactivity of an isocyanate with water to form an amine and carbon dioxide gas which cause the pressure within the OLED's protective chamber to be greater than the outside pressure, effectively preventing water and oxygen from entering the OLED's protective chamber and increasing the operable life of the OLED. Formula II also protect the OLED from oxygen by sequestering oxygen as a nitroso or nitro compound as described above. Exemplary of an isocyanate gas generating species is 2-methyl-acrylic acid-2-isocyanato-ethyl ester.

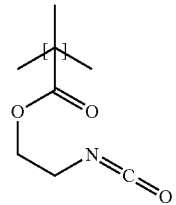

II

Azo compounds such as azo bis-(cyclohexanecarbonitrile) and azo bis-isobutyronitrile can also be used as the gas generating species present within the OLED's protective chamber. Azo compounds release nitrogen and readily sequester oxygen, thus increasing the operable life of the light emitting device. According to an embodiment, the operable life-span of a light emitting device according to the present technology is about 10,000 hours to about 40,000 hours. For certain embodiments, the operable life-span is about 10,000 hours, about 15,000 hours, about 20,000 hours, about 25,000 hours, about 30,000 hours, about 32,000 hours, about 34,000 hours, about 35,000 hours, about 36,000 hours, about 37,000 hours, about 38,000 hours, or about 39,000 hours.

The present technology also provides methods for the manufacture of an light emitting device by depositing an light emitting diode unit on a substrate, depositing a gas generating species on the substrate and overlaying the light emitting diode unit with a barrier material. According to this method of manufacture, the barrier is sealed to the substrate with a sealant and the barrier, sealant, and substrate together define a protective chamber encapsulating the organic light emitting diode unit, and the gas generating species.

In one embodiment the light emitting diode unit is an organic light emitting diode unit and the barrier is made of plastic, ceramic, glass, or a combination of any two or more of these materials. A first inert gas such as argon or nitrogen is present within the light emitting device's protective chamber to provide a barrier that prevents water, oxygen or both from contacting the OLED. For certain embodiments, the first inert gas may be replaced by a gas generating species, or alternatively, the gas generating species is included along with the first inert gas within the OLED's protective chamber. In this latter embodiment, the gas generated by the gas generating species may be the same as the first inert gas or the gas generated by the gas generating species may be different from the first inert gas to produce a light emitting device having a first and a second inert gas.

Illustrative of compounds suitable for use as the gas generating species include without limitation [40]K, a carbodiimide, an azo-compound, a cyanamide, a trizaole, an isocyanate or a combination of any two or more of these compounds. In one embodiment, at least one water-reactive material, at least one oxygen reactive material or both can be deposited on the substrate or included within the barrier prior to sealing to form the protective chamber.

The following examples more specifically illustrate protocols for manufacturing light emitting devices according to various embodiments described above. These examples should in no way be construed as limiting the scope of the present technology.

EXAMPLES

Example 1

Light-emitting devices will be fabricated on ITO substrates that will be cleaned and treated with $O_2$ plasma before use. Fabrication of the device proceeds by forming a layer of a hole-transport material (HTL) onto the surface of the ITO. Typically, a 1,2-dichloroethane (DCE) solution of the monomer of a material to be used as the HTL is spin coated onto the ITO surface followed by annealing at 225° C. under nitrogen atmosphere to produce a 40 nm thick HTL layer. Tetraphenyldiamine containing perfluorocyclobutane polymer (BTPD-PFCB), can be used to form the HTL.

Following spin-coating of the HTL material, a 3.0% by weight of an osmium complex in a doped blend of poly(N-vinylcarbazole) and 2-t-butylphenyl-5-biphenyl-1,3,4-oxadiazole (PVK:PBD, 70:30 by weight) will be spin coated using a 1,2-dichloroethane solution (about 12 mg/mL) at 2000 rpm. This coating is overlayed with a 30-nm-thick potassium-40 ($^{40}K$) layer that will be vacuum deposited at pressures less than $1 \times 10^{-6}$ torr through a mask in an argon protected evaporator. The entire device is sealed under an inert atmosphere using a glass slide and a ring of epoxy Devcon Fast Curing Adhesive Epoxy Gel to protect the OLED device from water and oxygen.

Example 2

Light-emitting devices containing a 1:1 mixture of potassium-40 ($^{40}K$) and calcium ($^{40}Ca$) as the inert gas generating species will be manufactured as follows. A layer of a hole-transport material (HTL) will be deposited onto the surface of an indium-tin oxide layer (ITO). Typically, a 1,2-dichloroethane (DCE) solution of the monomer of a material to be used as the HTL is spin coated onto the ITO surface followed by annealing at 225° C. under nitrogen atmosphere to produce a 40 nm thick HTL layer. Tetraphenyldiamine containing perfluorocyclobutane polymer (BTPD-PFCB), can be used to form the HTL.

Following spin-coating of the HTL material, a 3.0% by weight of an osmium complex in a doped blend of poly(N-vinylcarbazole) and 2-t-butylphenyl-5-biphenyl-1,3,4-oxadiazole (PVK:PBD, 70:30 by weight) will be spin coated using a 1,2-dichloroethane solution (about 12 mg/mL) at 2000 rpm. A 30-nm thick layer of an alloy containing 50% potassium-40 ($^{40}K$) and 50% calcium ($^{40}Ca$) is then vacuum deposited at a pressure less than $1 \times 10^{-6}$ torr through a mask in an argon protected evaporator on to the surface of the osmium complex. The entire assembly will be sealed under an inert atmosphere using a glass slide and a ring of epoxy Devcon Fast Curing Adhesive Epoxy Gel to protect the OLED device from water and oxygen.

Example 3

A $^{40}Ca$ light-emitting devices according to the present technology can be manufactured using the protocol described in Example 1. Fabrication will proceed by cleaning an ITO substrate and treating the substrate with $O_2$ plasma. A 40 nm thick hole-transport material (HTL), will be fabricated on to the ITO substrate by spin coating a 1,2-dichloroethane (DCE) solution of tetraphenyldiamine containing perfluorocyclobutane polymer (BTPD-PFCB), followed by annealing of the coating at 225° C. under an atmosphere of nitrogen.

A 3.0% weight layer of an osmium complex in a doped blend of poly(N-vinylcarbazole) and 2-t-butylphenyl-5-biphenyl-1,3,4-oxadiazole (PVK:PBD, 70:30 by weight) will then be spin coated at 2000 rpm onto the HTL using the corresponding DCE solution (about 12 mg/mL). Following spin coating a 30-nm-thick of calcium ($^{40}Ca$) will be vacuum deposited at pressures less than $1 \times 10^{-6}$ torr through a mask in an argon protected evaporator onto the surface of the spin coat.

The resultant OLED device is protected from contacting water, oxygen, or both by coating the device with a 1 mm thick film of a solution of 20% poly(methyl methacrylate) (MW 100,000) in 2-isocyanatoethyl methacrylate and 1% benzophenone under an inert atmosphere of argon. The protective coating is solidified by irradiating the polymer film with UV light.

Example 4

A potassium-40 ($^{40}K$) light-emitting devices according to the present technology will be manufactured using the protocol described in Example 1. Fabrication will proceed by cleaning an ITO substrate and treating the substrate with $O_2$ plasma. A 40 nm thick hole-transport material (HTL), will be fabricated on to the ITO substrate by spin coating a 1,2-dichloroethane (DCE) solution of tetraphenyldiamine containing perfluorocyclobutane polymer (BTPD-PFCB), followed by annealing of the coating at 225° C. under an atmosphere of nitrogen.

A 3.0% weight layer of an osmium complex in a doped blend of poly(N-vinylcarbazole) and 2-t-butylphenyl-5-biphenyl-1,3,4-oxadiazole (PVK:PBD, 70:30 by weight) will then be spin coated at 2000 rpm onto the HTL using the corresponding DCE solution (about 12 mg/mL). Following spin coating a 30-nm-thick of potassium-40 ($^{40}K$) will be vacuum deposited at pressures less than $1 \times 10^{-6}$ torr through a mask in an argon protected evaporator onto the surface of the spin coat. The resultant OLED device is protected from contacting water, oxygen, or both by coating the device with a 1 mm thick film of a solution of 20% poly(methyl methacrylate) (MW 100,000) in 2-isocyanatoethyl methacrylate and 1% benzophenone under an inert atmosphere of argon. The protective coating is solidified by irradiating the polymer film with UV light.

Example 5

Light-emitting devices containing calcium ($^{40}Ca$) as the inert gas generating species will be manufactured as follows. A layer of a hole-transport material (HTL) will be deposited onto the surface of an indium-tin oxide layer (ITO). Typically, a 1,2-dichloroethane (DCE) solution of the monomer of a material to be used as the HTL is spin coated onto the ITO surface followed by annealing at 225° C. under nitrogen atmosphere to produce a 40 nm thick HTL layer. Tetraphenyldiamine containing perfluorocyclobutane polymer (BTPD-PFCB), can be used to form the HTL. Following spin-coating of the HTL material, a 3.0% by weight of an osmium complex in a doped blend of poly(N-vinylcarbazole) and 2-t-butylphenyl-5-biphenyl-1,3,4-oxadiazole (PVK:PBD, 70:30 by weight) will be spin coated using a 1,2-dichloroethane solution (about 12 mg/mL) at 2000 rpm. A 30-nm thick layer of 50% calcium ($^{40}Ca$) is then vacuum deposited at a pressure less than $1 \times 10^{-6}$ torr through a mask in an argon protected evaporator on to the surface of the osmium complex.

A layer of potassium-40 ($^{40}K$) is vacuum deposited on to a separate glass slide. This slide is then placed over the calcium-40 layer so as to maintain a small space of about 0.05 mm to about 0.15 mm between the glass slide and the calcium layer. This assembly will be sealed under an inert atmosphere using a ring of epoxy Devcon Fast Curing Adhesive Epoxy Gel to obtain an OLED device.

Example 6

An OLED device containing calcium ($^{40}$Ca) as the inert gas generating species can also be manufactured as follows. A 40 nm thick HTL is first deposited onto a cleaned an $O_2$ plasma treated surface of ITO using the protocol described above. Following deposition, a 3.0% by weight of an osmium complex in a doped blend of poly(N-vinylcarbazole) and 2-t-butylphenyl-5-biphenyl-1,3,4-oxadiazole (PVK:PBD, 70:30 by weight) will be spin coated using a 1,2-dichloroethane solution (about 12 mg/mL) at 2000 rpm.

A 30-nm-thick layer of calcium (Ca) will be vacuum deposited on to the osmium complex at pressures less than $1 \times 10^{-6}$ torr through a mask in an argon protected evaporator. A ring of a solution of 20% poly(methyl methacrylate) (MW 100,000) in 2-isocyanatoethyl methacrylate and 1% benzophenone was placed around the resultant assembly under an inert atmosphere of argon. A layer of potassium-40 ($^{40}$K) will be vacuum deposited onto a separate glass slide and this glass slide will be placed in contact with polymer/monomer ring. The thickness of the polymer/monomer ring is such, so as to maintain a small (~0.1 mm) space between the calcium layer and the coated slide. The entire assembly will then be UV irradiated to polymerize and seal the OLED device.

Example 7

Testing of the physical and electrical characteristics of OLED devices manufactured using the present technology will be carried out at room temperature under normal conditions of temperature, pressure and in the presence of air. Current-voltage characteristics will be measured on a Hewlett Packard 4155B semiconductor parameter analyzer. Electroluminescent spectra will be measured with an Oriel InstaSpec IV CCD camera or a Photo Research PR650 calorimeter. The electroluminescent emission power will be measured using a Newport 2835-C multi-function optical meter in combination with a calibrated photodiode. Brightness will be calculated from the emission power and electroluminescent (EL) spectra of the manufactured devices, assuming Lambertian distribution of the EL emission, and confirmed using a PR650 colorimeter. Thickness of each of the films of the OLED device will be measured on a Sloan Dektak 3030 profilometer.

EQUIVALENTS

The embodiments, illustratively described herein may suitably be practiced in the absence of any element or elements, limitation or limitations, not specifically disclosed herein. Thus, for example, the terms 'comprising,' 'including,' 'containing,' etc., shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase 'consisting essentially of' will be understood to include those elements specifically recited and those additional elements that do not materially affect the basic and novel characteristics of the claimed technology. The phrase 'consisting of' excludes any element not specified.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent compositions, apparatuses, and methods within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as 'up to,' 'at least,' 'greater than,' 'less than,' and the like, include the number recited and refer to ranges which can be subsequently broken down into subranges as discussed above. Similarly, the phrase "at least about" some value such as, e.g., wt % includes at least the value and about the value. For example "at least about 1 wt %" means "at least 1 wt % or about 1 wt %." Finally, as will be understood by one skilled in the art, a range includes each individual member.

While certain embodiments have been illustrated and described, it should be understood that changes and modifications can be made therein in accordance with ordinary skill in the art without departing from the technology in its broader aspects as defined in the following claims.

What is claimed is:

1. A light emitting device, comprising:
a light emitting diode unit deposited on to a substrate, the light emitting diode unit comprising a cathode comprising $^{40}$K or an alloy of $^{40}$K;
a gas-generating species;
a barrier; and
a sealant;
wherein:
the sealant, barrier, and substrate define a protective chamber;
the light emitting diode unit, the gas generating species, and an inert gas are disposed within the protective chamber; and the gas generating species comprises $^{40}$K, a carbodiimide, an azo-compound, a cyanamide, a trizaole, an isocyanate or a combination of any two or more thereof.

2. The light emitting device of claim 1, wherein a water-reactive material, an oxygen-reactive material, or both a water-reactive material and an oxygen-reactive material are disposed within the sealant or the protective chamber.

3. The light emitting device of claim 1, wherein the inert gas comprises $N_2$, Ar or a combination thereof.

4. The light emitting device of claim 1, wherein a pressure within the protective chamber is from about 1 bar to about 1.2 bar.

5. The light emitting device of claim 1, wherein the sealant comprises an epoxy polymer, an acrylic polymer, an acrylamide polymer, a polystyrene, a polyurethane, polyurea, polythiophene, polyphenylene, polyphenylene oxide, polyimides, polyamide, polyvinyl acetate, polyvinyl alcohol, polyethylene, polyolefin, polyesters, polyether, polytetrafluoroethylene, or a combination of any two or more thereof.

6. The light emitting device of claim 1, wherein the gas-generating species is $^{40}$K.

7. The light emitting device of claim 1, wherein the inert gas comprises $^{40}$Ar.

8. The light emitting device of claim 1, wherein the gas generating species comprises dicyclohexyl carbodiimide, N,N'-diisopropyl carbodiimide, N-(2-methyliminomethylene-ethyl)acrylamide, a poly-N-(2-methyliminomethylene-ethyl)acrylamide or a combination of any two or more thereof.

9. The light emitting device of claim 1, wherein the gas generating species is poly-N-(2-methyliminomethylene-ethyl)acrylamide.

10. The light emitting device of claim 1, wherein the gas generating species is N-(1-H-(1,2,4)-triazol-3-yl)-acrylamide.

11. The light emitting device of claim 1, wherein the sealant comprises N-(1-H-(1,2,4)-triazol-3-yl)-acrylamide.

12. The light emitting device of claim 1, wherein the sealant comprises a polyacrylamide comprising a repeat unit represented by Formula I:

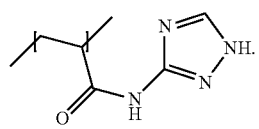

Formula I

13. The light emitting device of claim 1, wherein the gas generating species or the sealant comprises an isocyanate.

14. The light emitting device of claim 13, wherein the isocyanate is 2-methyl-acrylic acid-2-isocyanato-ethyl ester.

15. The light emitting device of claim 14, further comprising a polymerization product of 2-methyl-acrylic acid-2-isocyanato-ethyl ester, the polymerization product comprising repeating units according to Formula II:

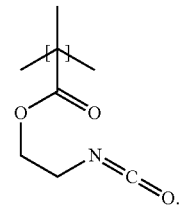

Formula II

16. A light emitting device, comprising:
a light emitting diode unit deposited on to a substrate;
a gas-generating species;
a barrier; and
a sealant;
wherein:
the sealant, barrier, and substrate define a protective chamber;
the light emitting diode unit, the gas generating species, and an inert gas are disposed within the protective chamber;
the gas generating species comprises $^{40}$K, a carbodiimide, an azo-compound, a cyanamide, a trizaole, an isocyanate, or a combination of any two or more thereof; and
the sealant comprises a polyacrylamide comprising repeating units represented by Formula I or an isocyanate comprising repeating units represented by Formula II with proviso that only one of Formula I and Formula II is present as the sealant:

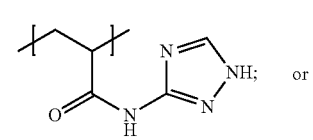

Formula I or

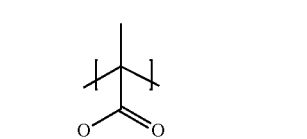

Formula II

17. The light emitting device of claim 16, wherein the light emitting diode unit is an organic light emitting diode unit.

18. The light emitting device of claim 16, wherein a water-reactive material, an oxygen-reactive material, or both a water-reactive material and an oxygen-reactive material are disposed within the sealant or the protective chamber.

19. The light emitting device of claim 16, wherein the inert gas comprises $N_2$, Ar or a combination thereof.

20. The light emitting device of claim 16, wherein a pressure within the protective chamber is from about 1 bar to about 1.2 bar.

21. The light emitting device of claim 16, wherein the gas-generating species is $^{40}$K.

22. The light emitting device of claim 16, wherein the inert gas comprises $^{40}$Ar.

23. The light emitting device of claim 16, wherein the gas generating species comprises dicyclohexyl carbodiimide, N,N'-diisopropyl carbodiimide, N-(2-methyliminomethylene-ethyl)acrylamide, a poly-N-(2-methyliminomethylene-ethyl)acrylamide, or a combination of any two or more thereof.

24. The light emitting device of claim 16, wherein the gas generating species is poly-N-(2-methyliminomethylene-ethyl)acrylamide.

25. The light emitting device of claim 16, wherein the gas generating species is N-(1-H-(1,2,4)-triazol-3-yl)-acrylamide.

26. The light emitting device of claim 16, wherein the gas generating species comprises an isocyanate.

27. The light emitting device of claim 26, wherein the isocyanate is 2-methyl-acrylic acid-2-isocyanato-ethyl ester.

28. The light emitting device of claim 27, further comprising a polymerization product of 2-methyl-acrylic acid-2-isocyanato-ethyl ester represented by Formula II:

$$\text{Formula II}$$

29. The light emitting device of claim 16, wherein the light emitting diode unit comprises a cathode comprising $^{40}K$ or an alloy of $^{40}K$.

* * * * *